United States Patent [19]
Numata et al.

[11] Patent Number: 5,294,929
[45] Date of Patent: Mar. 15, 1994

[54] CONTROL SYSTEM FOR PERIPHERAL DEVICES

[75] Inventors: Hiroshi Numata; Seiichi Nishiyama, both of Kanagawa, Japan

[73] Assignee: Sony Corporation, Japan

[21] Appl. No.: 910,540

[22] Filed: Jul. 9, 1992

[30] Foreign Application Priority Data

Jul. 18, 1991 [JP] Japan .................. 3-203501

[51] Int. Cl.$^5$ .......................... H03M 1/66
[52] U.S. Cl. ...................... 341/144; 341/141
[58] Field of Search .............. 341/144, 141, 118

[56] References Cited

U.S. PATENT DOCUMENTS

| | | | |
|---|---|---|---|
| 3,877,023 | 4/1975 | Spicer et al. ............ | 341/118 |
| 4,398,179 | 8/1983 | Kaneko ................... | 341/141 X |
| 4,429,384 | 1/1984 | Kaplinsky ................ | 370/85 |
| 4,968,988 | 11/1990 | Miki et al. ............... | 341/141 |
| 5,189,312 | 2/1993 | Shimizu et al. .......... | 341/144 X |

Primary Examiner—Sharon D. Logan
Attorney, Agent, or Firm—Ronald P. Kananen

[57] ABSTRACT

In a control system for peripheral devices, by operating only one device for digital-to-analogue conversion, the specific output switching corresponding to that specific device for digital-to-analogue conversion is closed and the other output switching corresponding to the other device for digital-to-analogue conversion are open so that the only the output signal of that specific device for digital-to-analogue conversion can be output. Thus, the accuracy of operation of each device for digital-to-analogue conversion can be easily evaluated.

15 Claims, 4 Drawing Sheets

|    | D5 | D4 | D3 | D2 | D1 |
|----|----|----|----|----|----|
| 1  | 0  | 0  | 0  | 0  | 0  |
| 2  | 0  | 0  | 0  | 0  | 1  |
| 3  | 0  | 0  | 0  | 1  | 0  |
| 4  | 0  | 0  | 0  | 1  | 1  |
| 5  | 0  | 0  | 1  | 0  | 0  |
| ⋮  |    |    | ⋮  |    |    |
| 8  | 0  | 0  | 1  | 1  | 1  |
| 9  | 0  | 1  | 0  | 0  | 0  |
| ⋮  |    |    | ⋮  |    |    |
| 16 | 0  | 1  | 1  | 1  | 1  |
| 17 | 1  | 0  | 0  | 0  | 0  |
| ⋮  |    |    | ⋮  |    |    |
| 32 | 1  | 1  | 1  | 1  | 1  |

CONTROL SYSTEM FOR PERIPHERAL DEVICES

BACKGROUND OF THE INVENTION

This invention relates to a control system for peripheral devices which is suitable, for example, for use in an integrated circuit (IC) containing plural digital-to-analogue converters.

A system is proposed wherein two integrated circuits are connected with a bus line comprising two signal lines, a serial clock SCL line and a serial data DTA line, so that an integrated circuit supplies serial data to the other integrated circuit. Here, the integrated circuit which receives the serial data converts the serial data to various kinds of analogue control signals with digital-to-analogue converters being therein and supplies these converted analogue control signals to peripheral devices.

These analogue control signals are, for example, a contrast control signal, brightness control signal, and the like. These control signals are transferred on the two signal lines with serial data, therefore desired signal processes can be achieved without having input terminals corresponding to each control signal.

However, in order to test these integrated circuits to know whether the digital-to-analogue converters being therein can operate or not, or in order to make an evaluation to check if the linearity error of output signal of each digital-to-analogue converter is less than $\pm\frac{1}{2}$ of the least significant bit in value, special troublesome testing is required during manufacturing. That is, the integrated circuit must have special terminals, just for testing, corresponding to each digital-to-analogue converter, for example terminals with testing holes through which a special fixture is set.

SUMMARY OF THE INVENTION

In view of the foregoing, an object of this invention is to provide a control system for peripheral devices in which the movement accuracy of each of plural a plurality of digital to analog converters being therein can be evaluated more easily.

The foregoing object and other objects of the invention have been achieved by the provision of a control system 1 which supplies control signals to peripheral devices after converting digital signals S1 and S2 to the control signals S11 through S15, that are analogue signals used to control the peripheral devices. The control system comprises a plurality of digital-to-analogue conversion 3A through 3E for converting the digital signals S1 and S2 to the analogue signals and outputting the converted analogue signals. Output switching device 7A through 7E are connected to the outputs of the plurality of digital-to-analogue converters means 3A through 3E respectively. When only a specific digital-to-analogue converters means 3A is in the evaluating mode, the output signal S11 of this specific digital-to-analogue converters 3A is output as an evaluation signal and the output signals S12 through S15 of other digital-to-analogue conversion means 3B through 3E are not output.

When only a specific digital-to-analogue converters 3A in the plurality of digital-to-analogue converters 3A through,. 3E is in operation, only the output switching device 7A corresponding to this specific digital-to-analogue converter is kept closed and the other output switching device 7B through 7E corresponding to the other digital-to-analogue converters 3B through 3E are kept open so that only output signal S11 is output. Thus, the linearity of the specific digital-to-analogue converter can be evaluated easily.

The nature, principle and utility of the invention will become more apparent from the following detailed description when read in conjunction with the accompanying drawings in which like parts are designated by like reference numerals or characters. dr

DETAILED DESCRIPTION OF THE INVENTION

Figure 1:
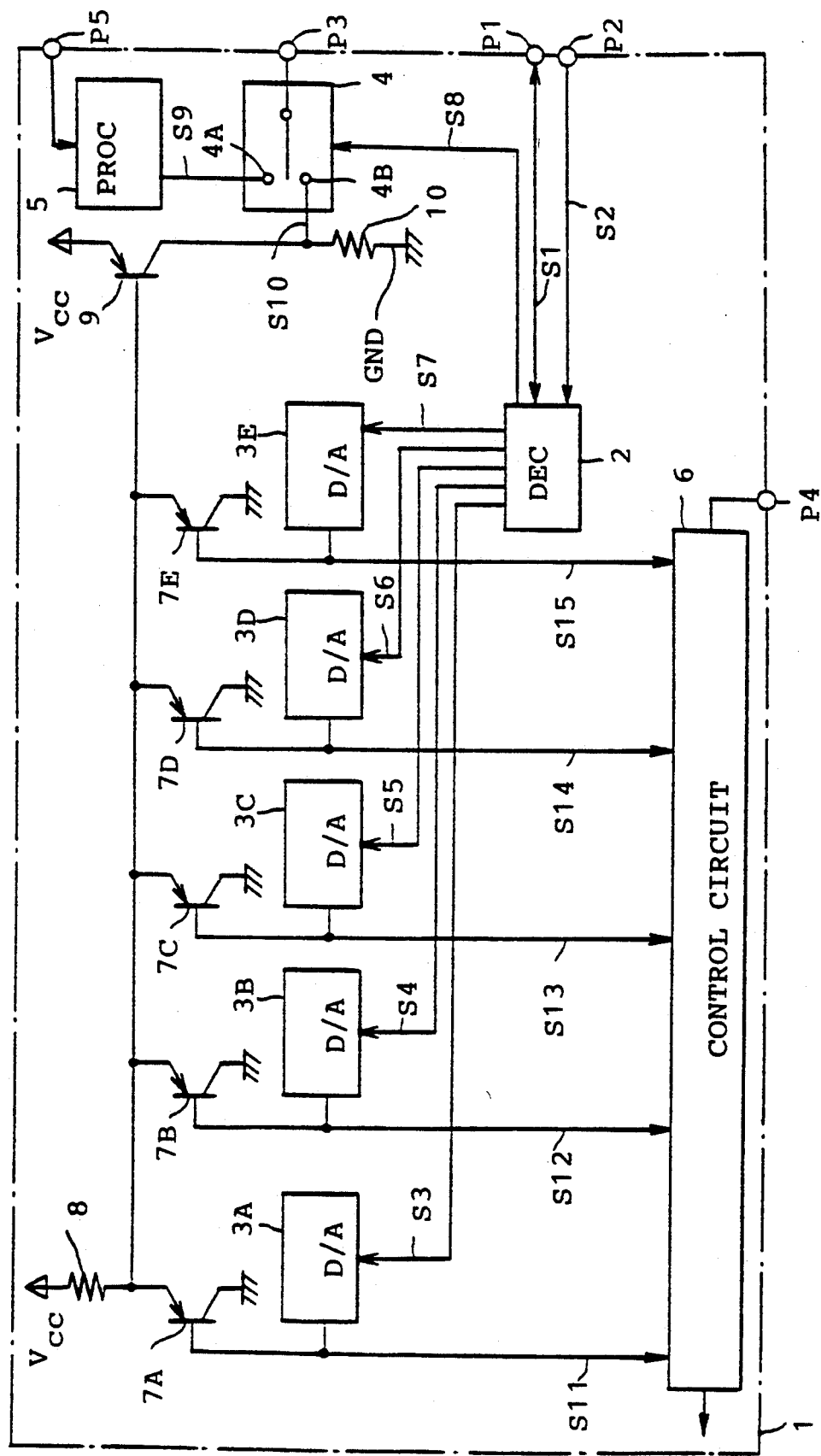
FIG. 1 is a schematic diagram of a control system for peripheral devices embodying the present invention.

Preferred embodiments of this invention will be described with reference to the accompanying drawings:

FIG. 1 shows in general an integrated circuit 1, wherein the serial data S1 comprising address and control information is applied via pin P1 to decoder 2 and the serial clock S2 is applied via pin P2 to decoder 2.

Based on the serial data S1, the decoder 2 supplies appropriate digital outputs S3, S4, S5, S6, and S7 to five digital-to-analogue converters 3A, 3B, 3C, 3D, and 3E respectively.

The decoder 2 also controls the output switching circuit 4 to select the input either 4A or 4B, by supplying output control signal S8 to the output switching circuit 4.

In this way, decoder 2 enables pin P3 to output the control signal S9, which is applied to the input terminal 4A from processing circuit 5, in a usual operation mode, and only when each digital-to-analogue converter 3A through 3E is tested it enables pin P3 to output the analogue signal S10 which is applied to the input terminal 4B.

Here, the pin P3 is an output terminal which the processing circuit 5 utilizes in the usual operation mode, and it is an output terminal in addition to the output terminals for supplying a ground voltage GND or a reference collector voltage $V_{cc}$ which is required for the evaluation of the outputs of the digital-to-analogue converters 3A through 3E.

In this way, by sharing the same output terminal with the processing circuit 5 will not require any special output terminals for digital-to-analogue converters 3A through 3E just for the testing, an evaluation of the DC voltages output from digital-to-analogue converters 3A through 3E can be achieved.

Figure 2:
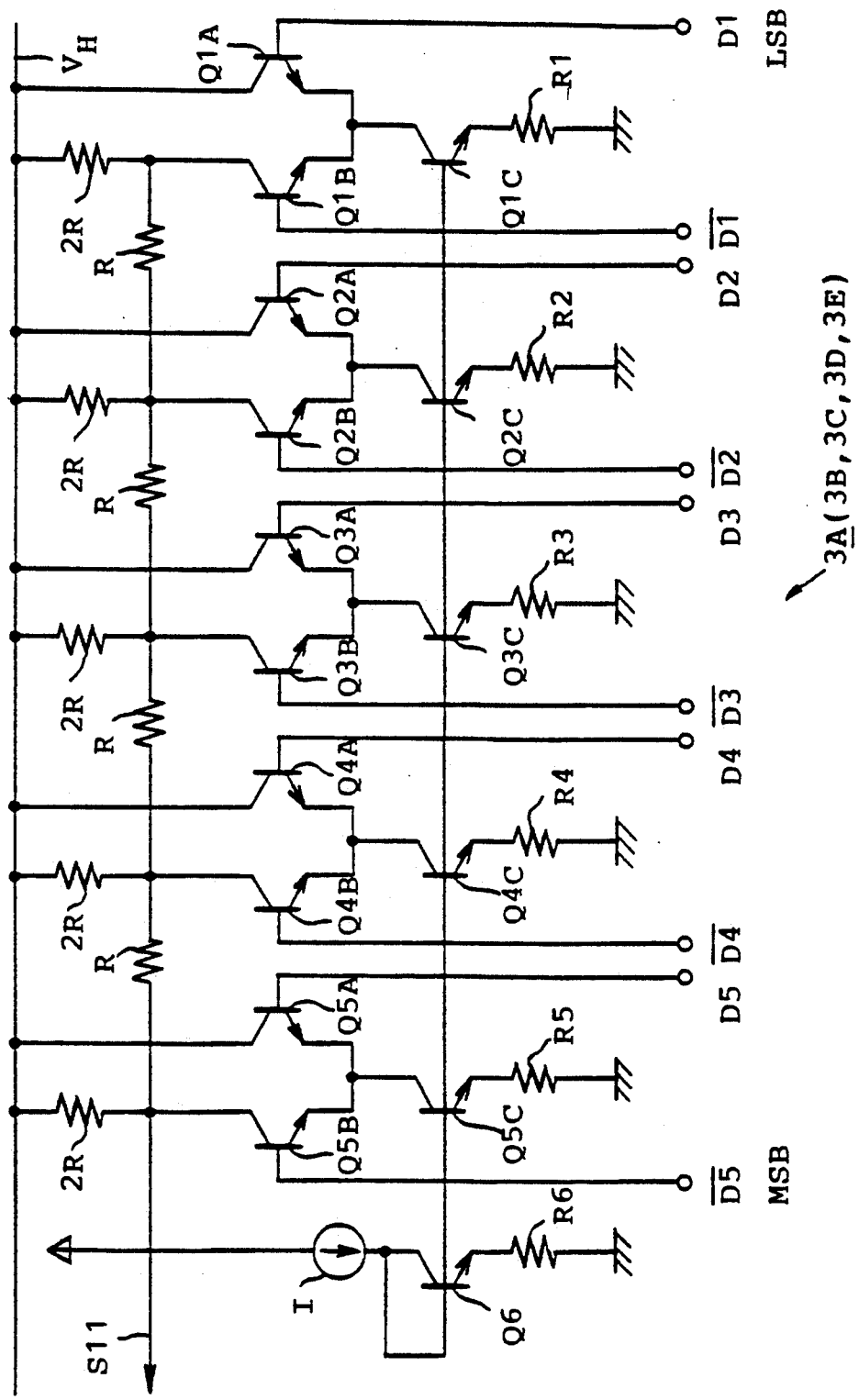
FIG. 2 is a schematic diagram for an explanation of a digital-to-analogue converter.

In this embodiment, the digital-to-analogue converters 3A through 3E are composed of ladder digital-to-analogue converters having R-2R weighted resistors as shown in FIG. 2. The digital-to-analogue converters 3A to 3E convert 5-bit (D1 through D5) digital signals S3 through S7 to analogue signals S11 through S15 which are applied to the control circuit 6.

Each of digital-to-analogue converters 3A through 3E has the nearly equal maximum output voltage $V_M$ and minimum output voltage $V_L$. Non-inverted 5-bit digital data D1 through D5 are applied to the transistors Q1A through Q5A, and inverted data of the digital data D1 through D5 are applied to transistors Q1B through Q5B.

The emitters of each pair of transistors Q1A and Q1B through Q5A and Q5B which constitute each differential amplifier are connected to the constant-current source comprising resistors R1 through R5 and transistors Q1C through Q5C which are connected to the transistor Q6 whose emitter is connected to resistor R6 to constitute the current mirrow to get the appropriate constant current.

In this configuration, the constant-current source I connected to the transistor Q6 is set to flow such a current that the middle point voltage of the digital-to-analogue converter 3A (3B through 3E) is identical to the average values of the maximum output voltage $V_H$ and the minimum output voltage $V_L$, i.e., $(V_H+V_L)/2$. In this embodiment, digital-to-analogue converters 3A through 3E deal with 5 bits, therefore the middle point voltage corresponds to "10000."

Each output S11 through S15 of the digital-to-analogue converters 3A through 3E is connected to each base of the PNP switching transistors 7A through 7E as well as to the control circuit 6. The emitters of the transistors 7A through 7E are connected to each other and also connected to the voltage source $V_{cc}$ via the resistor 8.

Furthermore, all of these emitters of the transistors 7A through 7E are also connected to the base of NPN detection transistor 9 so that output voltage V corresponding to the output of each digital-to-analogue converter is applied to the transistor 9.

The collector of the detection transistor 9 is connected to the resistor 10 so that the voltage according to the detected result of each digital-to-analogue converter is applied to the input terminal 4B of the output switching circuit 4.

In the usual operation of the above configuration, based on the serial data S1 and the serial clock S2 received via pin P1 and pin P2 respectively, the decoder 2 of IC 1 controls the output switching circuit 4 so that the output switching circuit 4 selects the input 4A to output the process signal of the processing circuit 5 therethrough at pin P3.

Meanwhile, the decoder 2 also supplies the 5-bit digital signals S3 through S7 to digital-to-analogue converters 3A through 3E based on the serial data S1 received via pin P1. These digital data are converted into analogue signals S11 through S15 and applied to the control circuit 6. Thus IC 1 supplies desired control signals via pin P4 to peripheral devices.

On the other hand, when it is required to evaluate, for example, the first digital-to-analogue converter 3A, to check whether the analogue signal S11 has the desired output voltage corresponding to the digital signal S3, the decoder 2 makes output switching circuit 4 switch the input from 4A to 4B.

At the same time, the decoder 2 also sets all bits D5 through D1 of all digital signals S4 through S7 to logic "1" (that is, "11111") which are applied to the second through fifth digital-to-analogue converters 3B through 3E.

Thus analogue voltages of the outputs of the second through fifth digital-to-analogue converters 3B through 3E get the maximum output voltage $V_H(=4.0[V])$, and, as a consequence, the second through fifth switching transistors 7B through 7E turn off.

At the same time, the decoder 2 sets all bits D5 through D1 to the least data, i.e., "00000" and supplies it to the first digital-to-analogue converter 3A.

Then the first digital-to-analogue converter 3A supplies the minimum output voltage $V_L(=2[V])$ to the base of the first switching transistor 7A. Thus the emitter voltage of the transistor 7A becomes 2.7[V]. This emitter voltage is applied to the input terminal 4B via the detection transistor 9 and is output at pin P3.

Based on the received data of the serial data S1, the decoder 2 sequentially sets bit data D5 through D1 to "00001," "00010," "00011," ... "10000," ... "11111" and applies them to the first digital-to-analogue converter 3A (see FIG. 3).

Whether the digital-to-analogue converter 3A is in normal operation or whether good enough linearity is obtained can be evaluated from the five test conditions, that is, transitions from "00000" to "00001," "00001" to "00010," "00011" to "00100," "00111" to "01000," and "01111" to "10000."

That is, when bit data D5 through D1 is changed from "00000" to "00001," the emitter voltage of the switching transistor 7A rises by a corresponding amount. Thus whether the transistors Q1A through Q1C which correspond to the least significant bit (LSB) are in correct operation or not can be evaluated.

Then, by checking whether the emitter voltage of the switching transistor 7A rises further more by a corresponding amount when bit data D5 through D1 is changed from "00001" to "00010," it can be evaluated whether the transistors Q2A through Q2C corresponding to the second bit are in correct operation.

Furthermore, by checking whether the emitter voltage of the switching transistor 7A rises more by a corresponding amount when bit data D5 through D1 is changed from "00011" to "00100," it can be evaluated whether the transistors Q3A through Q3C corresponding to the third bit are in correct operation.

In a similar way, whether the transistors Q4A through Q4C corresponding the fourth bit and transistors Q5A through Q5C corresponding to the most significant bit (MSB) are in correct operation or not can be evaluated by changing the bit data D5 through D1 from "00111" to "01000" and from "01111" to "10000" respectively.

Figures 3, 4:
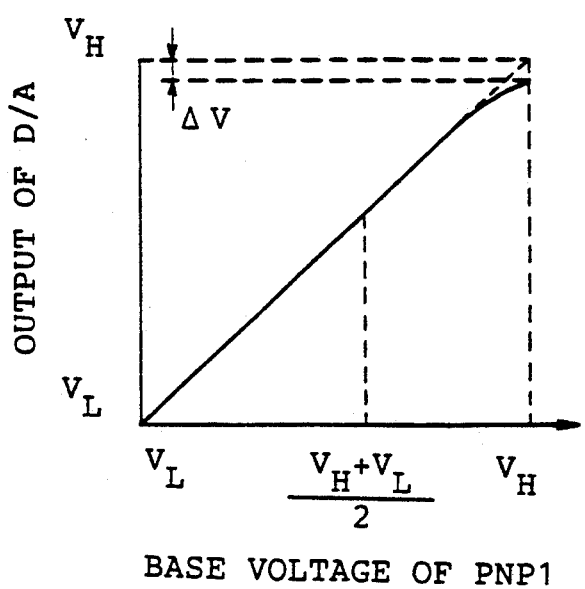
FIG. 3 is a table for an explanation of the input signal for evaluating a digital-to-analogue converter.
FIG. 4 is a graph for an explanation of an output signal of a digital-to-analogue converter.

As can be seen from the FIG. 4, if the changes in the output voltage at those five test conditions is evaluated, then it means that the linearity up to the middle point voltage $(V_H+V_L)/2$ has been already evaluated. Therefore, operation failure of the digital-to-analogue converter 3A can be detected from the reduction in the output voltage.

Incidentally, when the base voltage of the switching transistor 7A approaches the maximum voltage $V_H$, as shown in FIG. 4, the error of $\Delta V$ in the output voltage at pin P3 occurs in the worst case with respect to the output voltage of the digital-to-analogue converter.

Figure 5:
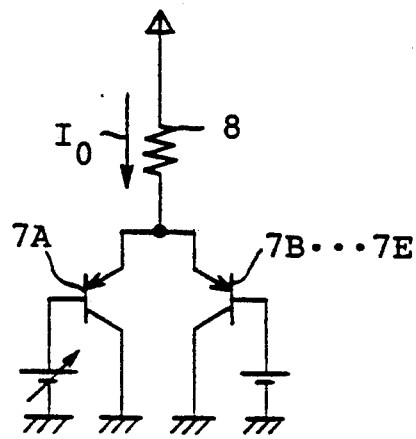
FIG. 5 is a circuit diagram for an explanation of the operation of a switching transistor.
Figure 6:
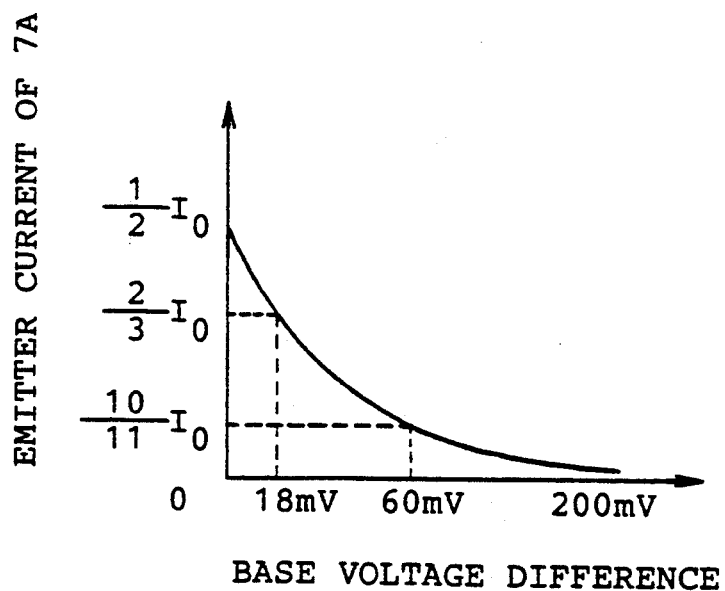
FIG. 6 is a graph showing the characteristics of the switching transistor of FIG. 5.

This is because, as shown in FIGS. 5 and 6, the first switching transistor 7A whose base voltage varies and the second through fifth transistors 7B through 7E whose bases are driven by the maximum voltage $V_H$ act as a comparator. The emitter current of the transistor 7A decreases as the base voltage of the first switching transistor 7A approach the maximum voltage $V_H$, and at last the second through fifth transistors 7B through 7E begin operating.

In this embodiment, there is the difference of 2[V] between the maximum voltage $V_H$ (=4.0[V]) and the minimum voltage $V_L$ (=2.0[V]). If this difference is larger than 500[mV], the linearity of the digital-to-analogue converter 3A can be detected with 3no evaluation for the bit data larger than "10001."

This is because the switching transistor does not reach the region where the error occurs, if the difference between the maximum voltage $V_H$ and the minimum voltage $V_L$, i.e., $V_H - V_L$, is larger than 500 [mV].

In a similar way, for detecting whether the second digital-to-analogue converter 3B can operate or not, or whether the good enough linearity is kept or not, bit data D5 through D1 applied to the first and the third through fifth digital-to-analogue converters 3A and 3C through 3E is set to "11111" so that the only second digital-to-analogue converter 3B operates thus. The linearity for the second digital-to-analogue converter 3B can be evaluated.

Whether or not the third through fifth digital-to-analogue converters 3C through 3E can operate, or whether or not the linearity of the output signal is maintained can be detected in a similar way by operating only the third through fifth digital-to-analogue converter 3C through 3E respectively.

By the above constitution, it can be easily evaluated whether or not the digital-to-analogue converters 3A through 3E in the integrated circuit are in normal operation, or whether or not the good linearity is maintained, by means of operating the only corresponding specific switching transistors 7A through 7E.

In the embodiment described above, PNP transistors are utilized for switching transistors 7A through 7E, however the present invention is not limited to that, but NPN transistors can be successfully used.

Furthermore, in the embodiment described above, resistor 8 is utilized for the current source which is connected in common to each emitter of the switching transistor 7A through 7E, however the present invention is not limited to that, but the current source composed by the transistors and the like can be used. In such a case, the error voltage $\Delta V$ near the maximum voltage $V_H$ can be reduced.

Furthermore, in the embodiment described above, 5-bit ladder digital-to-analogue converters are utilized for the digital-to-analogue converters 3A through 3E, however the present invention is not limited to that, but other kinds of digital-to-analogue converters can be used.

In the embodiment described above, five digital-to-analogue converters are utilized, however the present invention is not limited to that, but a wide variety of the number, more than two, in digital-to-analogue converters can be successfully used.

Furthermore, in the embodiment described above, 5-bit ladder digital-to-analogue converters are utilized for the digital-to-analogue converters 3A through 3E, however the present invention is not limited to that, but digital-to-analogue converters which convert digital data of larger than 2 bits to analogue signal, for example, 6-bit ladder digital-to-analogue converter can be used.

Furthermore, in the embodiment described above, the linearity of the digital-to-analogue converters in the integrated circuit are evaluated, however the present invention is not limited to that, but this invention can be widely applicable to the circuits which receive the serial data SDA and serial clock SCL via the bus.

As described above, in this invention, to test only one specific digital-to-analogue conversion means in a plurality digital-to-analogue conversion means, the only specific output switching means corresponding to that specific digital-to-analogue conversions means is closed and other output switching means corresponding to the other digital-to-analogue conversion means are open so that the output signal of that specific digital-to-analogue conversion means can be output. Thus, operation of the digital-to-analogue conversion means can be easily evaluated.

While this has been describe din connection with the preferred embodiments of the invention, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. A control system which supplies control signals to peripheral devices for controlling said peripheral devices, comprising:
    a plurality of digital-to-analogue conversion means, each having a respective output, for receiving digital signals, for converting said digital signals to analogue signals, and for outputting said analogue signals as said control signals for controlling said peripheral devices; and
    output switching means connected to the outputs of said plurality of digital-to-analogue conversion means;
    wherein when only a specific digital-to-analogue conversion means is paced in an evaluating mode, an output signal of said specific digital-to-analogue conversion means is supplied to said output of said control system as an evaluation signal and output signals of the other of said digital-to-analogue conversion means are not supplied to said output of said control system.

2. The control system according to claim 1, wherein:
    said output switching means is connected to a processing circuit in a normal mode of operation, and switches said output of said control system from said processing circuit to said digital-to-analogue conversion means at a start of said evaluating mode.

3. The control system according to claims 1 or 2, further comprising:
    decoder means for receiving serial data from outside said control system in said evaluating mode, and then for providing an evaluating control signal to said specific digital-to-analogue conversion means and a switching control signal to said output switching means to select the output of said specific digital-to-analogue conversion means.

4. The control system according to claim 1 or 2, wherein said control system is mounted on an integrated circuit.

5. The control system according to claim 3, wherein said control system is mounted on an integrated circuit.

6. A control system which supplies control signal to peripheral devices for controlling said peripheral devices, comprising:
    a plurality of digital-to-analogue conversion means, each having a respective output, for receiving digital signals, for converting said digital signals to analogue signals, and for outputting said analogue signals as said control signals for controlling said peripheral devices; and output switching means, connected to the outputs of said plurality of digital-to-analogue conversion means and to a processing circuit, for switching a processing circuit to an output of said control system in a normal mode of operation and for switching said digital-to-analogue conversion means to said output of said control system in an evaluating mode of operation;

wherein when only a specific digital-to-analogue conversion means is placed in the evaluating mode, an output signal of said specific digital-to-analogue conversion means is supplied to said output of said control system as an evaluation signal and output signals of the other of said digital-to-analogue conversion means are not supplied to said output of said control system.

7. The control system according to claim 6, further comprising decoder means for receiving said input signal, for generating a switching control signal, and for transmitting said switching control signal to said switching means to place said switching means either in said normal mode or in said evaluating mode.

8. A control system which outputs control signals to peripheral devices for controlling said peripheral devices, comprising:

a plurality of digital-to-analogue conversion means, each having a respective output, for receiving digital signals, for converting said digital signals to analogue signals, for converting said digital signals to analogue signals, and for outputting said analogue signals as said control signals for controlling said peripheral devices; and output switching means, connected to the outputs of said plurality of digital-to-analogue conversion means and to a processing circuit, for switching said processing circuit to an output of said control system in a normal mode of operation and for switching said digital-to-analogue conversion means to said output of said control system in an evaluating mode of operation;

wherein said output switching means switches said output of said control system between said processing circuit in said normal mode and said digital-to-analogue conversion means in said evaluating mode based upon an input signal supplied to said control system.

9. The control system according to claim 8, wherein said input signal comprises serial digital data supplied to an input of said control system.

10. The control system according to claim 8, further comprising decoder means for receiving said input signal, for generating a switching control signal, and for transmitting said switching control signal to said switching means to place said switching means either in said normal mode or in said evaluating mode.

11. The control system according to claim 8, wherein when said control system is in said evaluating mode of operation, each of said plurality of digital-to-analogue conversion means is successively connected to said output of said control system whereby a linearity of each of said plurality of digital-to-analogue conversion means is evaluated.

12. The control system according to claim 11, wherein:

each of said plurality of digital-to-analogue conversion means has a separate bit conversion means for each bit in said digital signals; and when each of said plurality of digital-to-analogue conversion means is connected to said output in said evaluating mode, said linearity is evaluated by testing each bit conversion means.

13. A control system which supplies at least one control signal to at least one peripheral device for controlling said peripheral device, comprising:

digital-to-analogue conversion means for receiving a digital signal and for converting said digital signal into an analogue signal;

output switching means for receiving said analogue signal from said digital-to-analogue conversion means and a second signal from a processing means and for outputting said analogue signal to an output of said control system in an evaluating mode of operation and for outputting said second signal to said output of said control system in a normal mode of operation; and means for receiving an input signal at an input to said control system and for generating a switching control signal that is supplied to said output switching means to place said output switching means in either said normal mode or in said evaluating mode.

14. The control system according to claim 13, wherein said digital-to-analogue conversion means comprises a bit conversion means for each bit in said digital signal and when said control system is placed in said evaluating mode, a linearity of said digital-to-analogue conversion means is evaluated by separately checking each of said bit conversion means.

15. The control system according to claim 13, wherein said means for receiving said input signal comprises a decoder and said input signal comprises serial input data.

* * * * *